United States Patent [19]
Schmitt et al.

[11] Patent Number: 6,074,691
[45] Date of Patent: Jun. 13, 2000

[54] METHOD FOR MONITORING THE FLOW OF A GAS INTO A VACUUM REACTOR

[75] Inventors: Jacques Schmitt, La Ville du Bois, France; Emmanuel Turlot, Balzers, Liechtenstein; Frangois Leblanc, Machida, Japan

[73] Assignee: Balzers Aktiengesellschaft, Germany

[21] Appl. No.: 08/881,759
[22] Filed: Jun. 24, 1997
[51] Int. Cl.⁷ ........................................... C23C 16/00
[52] U.S. Cl. ........................... 427/8; 137/551; 427/248.1; 427/255.23; 427/569; 427/582; 427/585
[58] Field of Search ..................... 137/551; 427/255.23, 427/569, 582, 585, 248.1, 8

*Primary Examiner*—Bernard Pianalto
*Attorney, Agent, or Firm*—Evenson, McKeown, Edwards & Lenahan P.L.L.C.

[57] ABSTRACT

A method for monitoring the actual flow of a gas into a vacuum facility, which flow of gas resulting from setting a desired flow of gas by means of at least one adjustable mass flow controller, interconnected between said facility and a pressurized reservoir arrangement for said gas.

25 Claims, 6 Drawing Sheets

METHOD FOR MONITORING THE FLOW OF A GAS INTO A VACUUM REACTOR

BACKGROUND OF THE INVENTION

This invention relates generally to the accurate control of the flow of a gas into a vacuum facility. More specifically, it is directed to a method for monitoring the flow of a gas into a vacuum facility, which flow of a gas resulting from setting a desired flow of gas by means of at least one adjustable mass flow controller, which is interconnected between the vacuum facility and a pressurized reservoir arrangement for the gas.

Mass flow controllers are rather unstable regulating devices. They require to go regularly back to a calibration bench. For large companies which run many mass flow controllers the trend is to purchase and use internal calibration benches.

One of the most serious problems with mass flow controllers is that they tend to drift gradually, rather than jumping off a preset value, which latter would be easily detectable. Drift is critical to be permanently monitored, whereby it is further difficult to adequately set a limit to offset, which is still acceptable or is not anymore acceptable. With the drift of the mass flow controller, the properties resulting from any gas flow dependent process in a vacuum facility are likely to be drifting away, too. Thus, e.g. the properties of substrate or workpieces treated in a vacuum reactor will drift away due to mass flow controller drifting.

The reason why mass flow controllers, MFCs, can drift, is not fully known. One of the reasons is that MFCs use very narrow tubing and are therefore sensitive to perturbation by dust, even of very small grain. Another reason is related to the fact that MFCs are using heat transfer for sensing the flow. The hot area can promote locally chemical reactions and local chemical vapor deposition, especially when reactive gases are flown. Both these phenomena possibly at least contribute to unbalance of the heat sensing bridge and would explain that especially MFCs, which are used for flows of corrosive and reactive gases, such as for Ammonia, HCl, do drift as well as MFCs, which are used together with dust generating gases, as for Silane.

The consequences of pure MFC reliability is costing a lot to the industry. For instance, in semi-conductor manufacturing plants which are using hundreds of MFCs which are systematically exchanged for systematic control. Such operation is repeated every three to four weeks. The corresponding costs are considerable. Such frequent control does additionally induce secondary risks, such as gas line contamination due to frequent exposure to ambient of some sections of the gas lines during MFC exchange. However, despite the costs and the risks due to MFC systematic exchange, plant responsible staff have apparently concluded that these costs are still less serious than the risk and the consequences attached to drifting MFCs and drifting manufacturing processes.

The drift of MFCs is not easily predictable, some MFCs can remain perfectly stable for years, while another starts to drift from the very first day it is installed after calibration. Hence, the frequency for recalibration has to be defined very conservatively based rather on the worst case, and thus on a rather short lifetime of some MFCs. Thereby, the case where an MFC starts to drift the day after installation may clearly not be taken into account, but one must live with such risk.

In FIG. 1 there is shown prior art gas flowing into a vacuum facility, as especially into a vacuum treatment reactor.

A gas tank arrangement shown as a pressurized gas tank 1 is as an example pressurized to a pressure $p_1$ of above 10 bar. Downstream of tank 1 there is provided a pressure regulator 2, which of reduces the input pressure $p_1$ to an output pressure $p_2$ slightly above 1 bar. Downstream of the regulator 2 there is provided a mass flow controller, MFC3. The pressure drop between the input and output of the mass flow controller 3 is about 1 bar, resulting in an output pressure $p_1$ of about 0.01 bar.

Downstream of MFC3 there is provided the vacuum facility 4, as e.g. a vacuum surface treatment reactor, into which, as schematically shown, e.g. via a shower-like gas distributor, the gas from tank 1 is input.

The output pressure $p_3$ at the output of MFC3 slowly drops along the connecting line to the reactor 4 according to its flow cross-section and length. The input nozzle arrangement causes a further slight pressure drop abutting in the process-required pressure $p_4$ in the vacuum reactor. Via a throttle 5 the reactor 4 is connected to a vacuum pump 6.

Thus, when flowing all along from the gas tank 1 to the low-pressure vacuum facility 4 or process equipment, the gas experiences successive drops in pressure as is shown in this figure.

The gas is flowing naturally all the way to the pump 6 inlet due to the potential energy of the compression in tank 1 as delivered by the gas supplier, combined with the potential energy provided by the vacuum pump 6, keeping the pressure in the vacuum facility 4 on the desired low level.

The MFC regulates, accurately within the above mentioned limits, the gas flow as long as a predetermined pressure drop is maintained according to $p_{23}$, which is e.g. at least 30 mbar. The minimum required pressure drop $p_{23}$ is marked as $p_{28min}$ in FIG. 1. As the pressure $p_2$ upstream the MFC is usually of the order of 1 to 2 bar, the MFC will be in good regulating operation as long as the output pressure $p_2$ just after the MFC is in the order of 0.95 bar. There results that the pressure drop required across the MFC, $p_{23min}$, is significantly lower than the actual pressure drop $p_{23}$ according to FIG. 1, which is in the range of 1 bar. This is due to the fact that downstream of the MFC there prevails nearly the required vacuum facility low pressure $p_4$, thus a process pressure in reactor 4, which may range, as an example, between 0.01 to 10 mbar or even much lower, i.e. down to the range of $10^{-3}$, $10^{-4}$ mbar.

SUMMARY OF THE INVENTION

It is an object of the present invention to provide a method for monitoring the actual flow of a gas into a vacuum facility by which inaccuracies of a mass flow controller, which leads to the actual gas flow being offset from the desired gas flow set at the mass flow controller, may accurately be monitored by means of rather inexpensive hardware, so that even existing plants may easily be retrofitted.

This object is realized by the steps of interconnecting a gas flow conductance element between the facility and the mass flow controller, predetermining a pressure drop along the gas flow conductance element at the desired flow of gas to be set at the mass flow controller, monitoring the actual gas flow along the gas flow conductance element by measuring a pressure drop along that element. This pressure drop is then compared with the predetermined pressure drop which corresponds to a desired flow of gas and has been established in a calibration procedure, whereas the measured pressure drop accords to the actual flow of gas.

It is a further object of the present invention to realize the inventive method under its most generic aspect without being forced to change the pressure in the pressurized tank 1, which is realized by further selecting the flow conductance element so that the predetermined pressure drop at the desired flow of gas exploits a part of the "rested" prior art pressure drop across the mass flow controller. As was shown, even at a considerable reduction of the pressure drop across the KFC, proper regulating function is maintained.

It is a further object of the present invention not only to monitor any differences between actual flow of gas and desired flow of gas, but to automatically readjust members in the gas feed line, which influence gas flow, so that automatically the actual gas flow is maintained on the desired gas flow value. This is accomplished by generating a difference signal from comparing the pressure drop measured and the predetermined pressure drop and adjusting e.g. the mass-flow controller as a function of the difference signal in a negative-feedback loop. For realizing the above mentioned general object-there is further proposed a vacuum arrangement, comprising a vacuum facility and at least one gas feed line leading from a pressurized gas reservoir arrangement via at least one gas mass flow controller to the facility and at least one gas flow conductance element interconnected between the facility and the gas mass flow controller. There in further provided a pressure difference measuring arrangement, one input thereof being operationally connected to an upstream part of said flow element, the second input thereof being operationally connected to a downstream part of the flow element, the output of the pressure difference measuring arrangement generating a signal indicative of actual mass flow of gas along the line and towards the facility.

Thereby, the basic idea is to use the potential energy loss of the gas flow due to the pressure drop the gas experiences between the outlet of the mass flow controller and the inlet of the facility, especially a vacuum treatment reactor for surface treating workpieces or substrates. The flow measurement uses the pressure drop along a flow conductance element which is a passive flow resistive line through which the process gas or gas mixture is flowed. An will be seen such flow conductive elements may be constructed by elements, as by a rather long tube with a rather small diameter, by one or more than one restriction of flow cross-section in a tube, by a nozzle, by a porous member introduced in a tube or by two or more than two such members connected in parallel, as by parallel connected tubes.

The inventive method with its preferred embodiments as well as the inventive arrangement with all its preferred forms of embodiment and the respective advantages shall now be described by example with the help of further figures.

BRIEF DESCRIPTION OF THE DRAWINGS

In the figures there is shown:

FIG. 2 shows the present invention under its most generic aspect. The pressurized gas tank 1 containing a gas or gas mixture is, still according to FIG. 1 and thus according to prior art, connected to a pressure regulator 2. There is further provided, downstream of the regulator 2, a mass flow controller MPC 3, which is customarily controllable at a control or adjusting input S.

The gas flow is led to a vacuum facility 4 and especially to a vacuum workpiece treatment reactor, especially to a low-pressure CVD reactor or a reactor for plasma enhanced CVD or in fact to any vacuum treatment reactor making use of a working gas and/or a reactive gas inlet at accurately predetermined flow. The vacuum facility 4 is evacuated by means of a vacuum pump 6.

Interconnected between the output of the MFC3 and the input of the vacuum facility 4, there is provided a gas flow conductance element 8, realized in its preferred forms, as shown in the FIGS. 6 to 9. The flow conductance element 8 represents flow resistive conductance, as do all the elements as shown in FIGS. 6 to 9, which shall later be described, so that a gas flow along such element 8 results in a pressure drop $p_{34}$.

Figure 2:
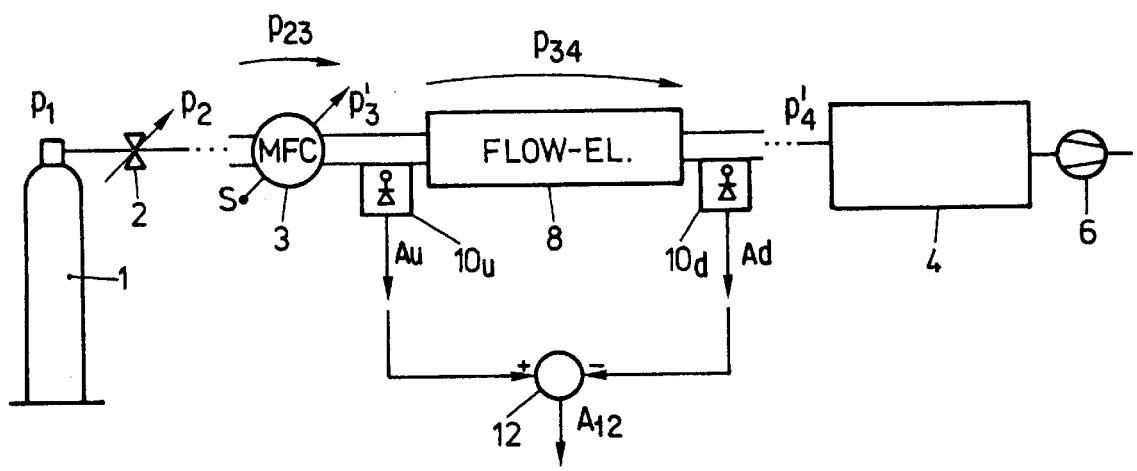
FIG. 2 schematically the inventive arrangement, operating according to the inventive method in a basic form of realization.

According to FIG. 2 there is provided a pressure difference measuring arrangement, one input thereof being operationally connected to the upstream and of the flow conductance element 8, the other input thereof being operationally connected to the downstream end of this element 8. Such a pressure difference measuring arrangement may be realized by a single difference pressure measuring sensor or, and as shown in FIG. 2, by means of two pressure measuring gauges $10_u$ and $10_d$, which both, as mechanical electrical transducers, generate an electrical output signal $A_u$ and $A_d$ respectively.

In this case the electrical outputs are led to a difference forming unit 12, generating an output signal $A_{12}$ as a function of pressure drop $p_{34}$ and thus as a function of the actual gas flow along element 8.

Figure 3:
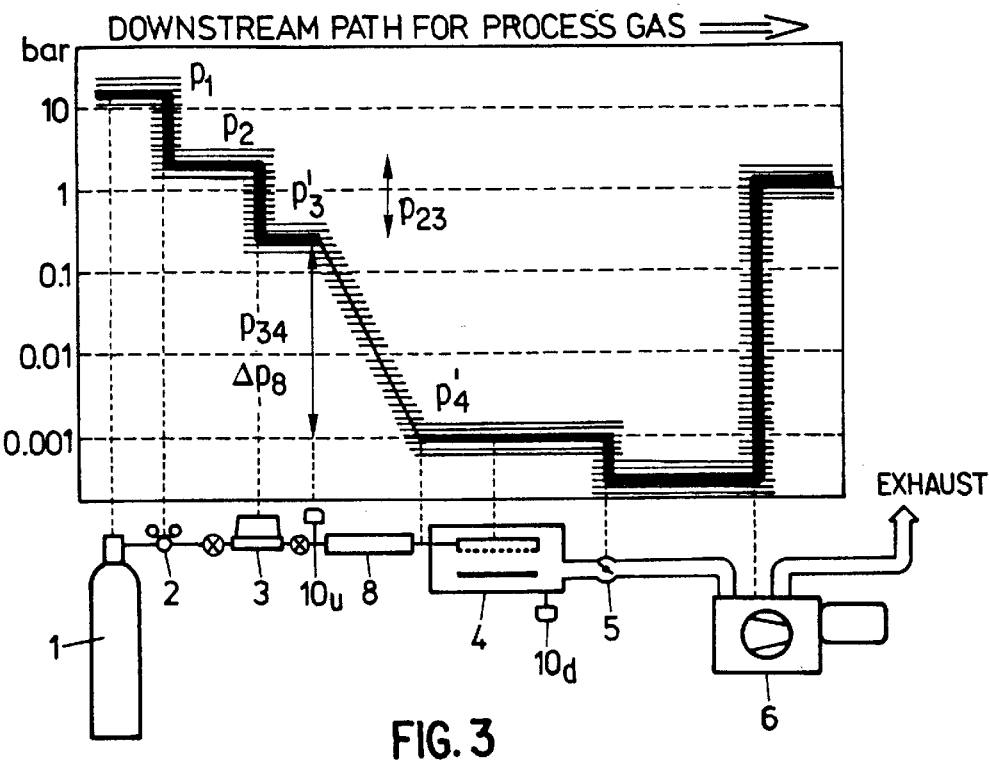
FIG. 3 in a representation according to FIG. 1 on one hand an inventive arrangement operating according to the inventive method and, on the other hand, the resulting course of pressure along the gas feed line.

In FIG. 3 functioning and structure of the invention are exemplified in a quantitative example. The same reference numbers are used as in FIG. 2 or FIG. 1.

Figure 1:
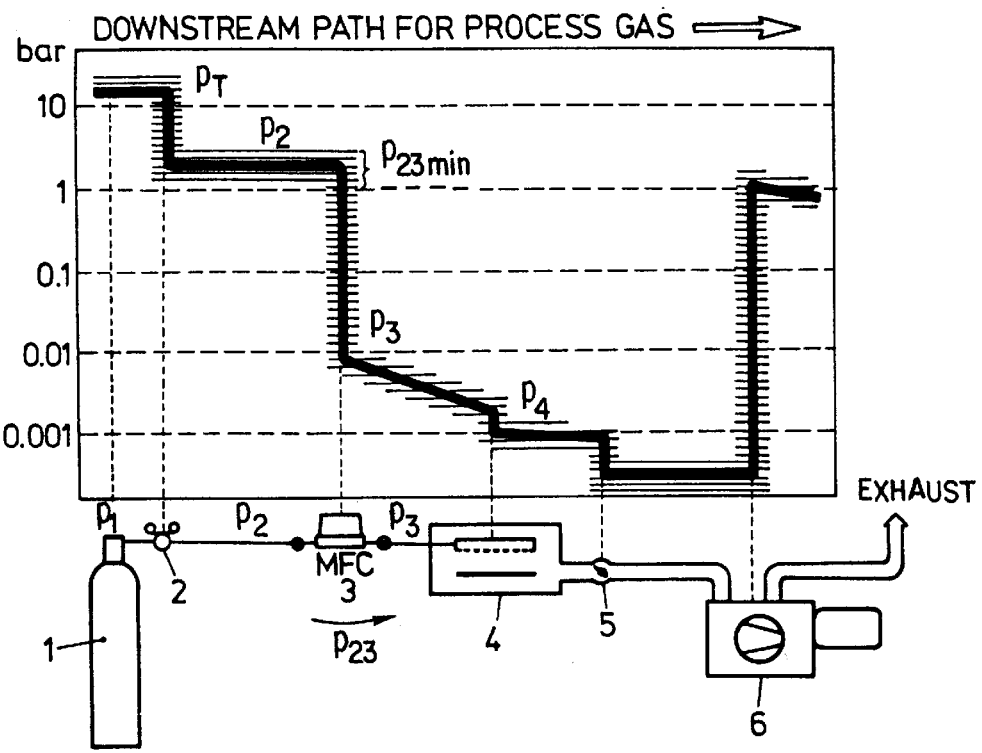
FIG. 1 an already described prior art gas feed arrangement to a vacuum treatment reactor, as a vacuum facility, and, still as an example, the resulting pressure variations along the gas feed line.

It might be seen that, compared with FIG. 1, at an equal pressure $p_1$, an equal pressure reduction to $p_2$ by regulator 2, there is established a reduced pressure drop $p_{23}$ across the MFC3 of about 0.7 bar, which nevertheless amply suffices to maintain proper regulating operation of MFC3. Between the upstream end and downstream end of the inventively introduced flow conductance element 8, there is generated the pressure drop $p_{34}$ according to $\Delta p_8$, which is substantially the pressure difference between output of the MFC and pressure $p_4$ in the vacuum facility 4. This nevertheless depends from where exactly the upstream pressure sensor $10_u$ and the downstream pressure sensor, $10_d$ are located along the line between MFC3 and reactor 4. Therefore, the respective pressures are indicated in FIG. 2 and in FIG. 3 by $p_3'$ and $p_4'$.

As may clearly be seen the pressure drop across the MFC3 is still much larger than the minimum pressure drop $P_{23min}$ for accurate regulating function. The pressure drop $p_{34}$ is preferably selected to be between 0.05 bar and 1 bar, preferably to be at least 0.1 bar. This pressure drop is measured by the upstream pressure gauge $10_u$, and in a preferred mode, directly by the pressure gauge $10_d$, which measures pressure in the vacuum facility 4, i.e. in the vacuum reactor. The measured pressure difference is directly correlated to the actual gas flow. Thus, the basic idea of the present invention is to use this pressure difference measurement to double-check the behavior and thus accuracy of the MFC3 during operation of the overall plant.

With an eye on FIGS. 6 to 9, the flow conductance element 8 is shown in different forms of realization 8a to 8d.

Figure 6:
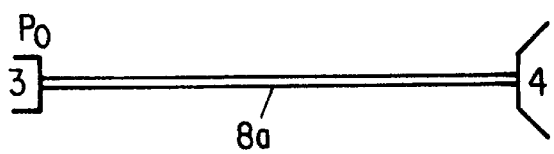
FIG. 6 a first form of realizing the gas flow conductance element according to the FIGS. 2, 4 and 5.
Figure 7:
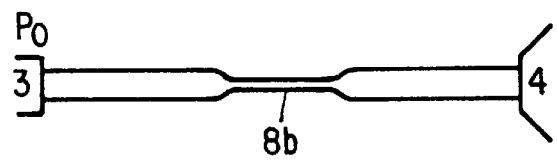
FIG. 7 a second form of realizing the gas flow conductance element.

According to FIG. 6, the flow conductance element 8 consists of at least one narrow tube of a given length, According to FIG. 7 it consists of one or more restrictions of flow cross-section of a tube interconnecting the output of the MFC3 and the input to the vacuum facility 4.

Figure 8:
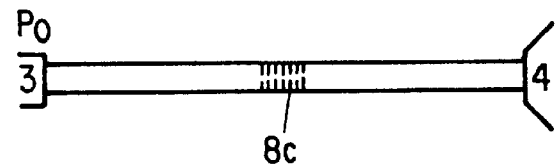
FIG. 8 a further realization form of the gas flow conductance element.

According to the FIG. 8 the flow conductance element consists of a porous block or a porous membrane introduced in a tube interconnecting MFC3 and vacuum facility 4.

The conductance of element 8 must be designed and calculated according to a pressure $p_o$, which is generated by the maximum desired gas flow at the entrance of the element a and thus being equal to the output of the MFC3. Taking into account reproducibility, smallest value of desired gas flow and largest value of desired gas flow and, with respect to $p_0$, equal gas flows should result in equal values for $p_0$ the minimum value of $p_0$ must be accurately measurable without too much hardware efforts and the maximum value of $p_0$ should nevertheless guarantee $p_{23min}$ for accurate regulating operation of the MFC3 and should therefore not be higher than $p_2$–0.1 bar, $p_2$ is, as was said, the pressure in the gas line as defined by the regulator 2. It is usually around 2 bar.

The flow conductance element 8, as a passive flow restrictor, should further be made of a material resistant to chemical gases, as used e.g. for reactive vacuum surface treatment with or without plasma enhancement. The main differentiation between different possibilities for realizing the flow conductance element is dependent on the nature of gas flow regime in the flow element. It can be molecular, viscous, turbulent or a combination thereof. Examples of design are given below.

Another key component is the pressure gauge $10_u$. Indeed, the accuracy of the system is defined by the pressure gauge. For the pressure regime, as for e.g. shown in FIG. 2, we have found that a most suited pressure gauge is one of the capacitive type. Provided it is temperature-controlled, as will be described, such a capacitive type pressure gauge leads to most reproducible results, is not sensitive to reactive gases and gas mixture concentration and is able to cover a pressure range accurately between 1 mbar and 1 bar.

If the flow element 8 is realized according to FIG. 6 with e.g. a stainless steel tube with a length of about 50 cm, and with an inner diameter of 2 nm, there results a laminar flow for typical gas flows. Different lengths and/or diameters can nevertheless be considered in order to adapt to another system with different gas flow ranges and different pressure values.

Figure 16:
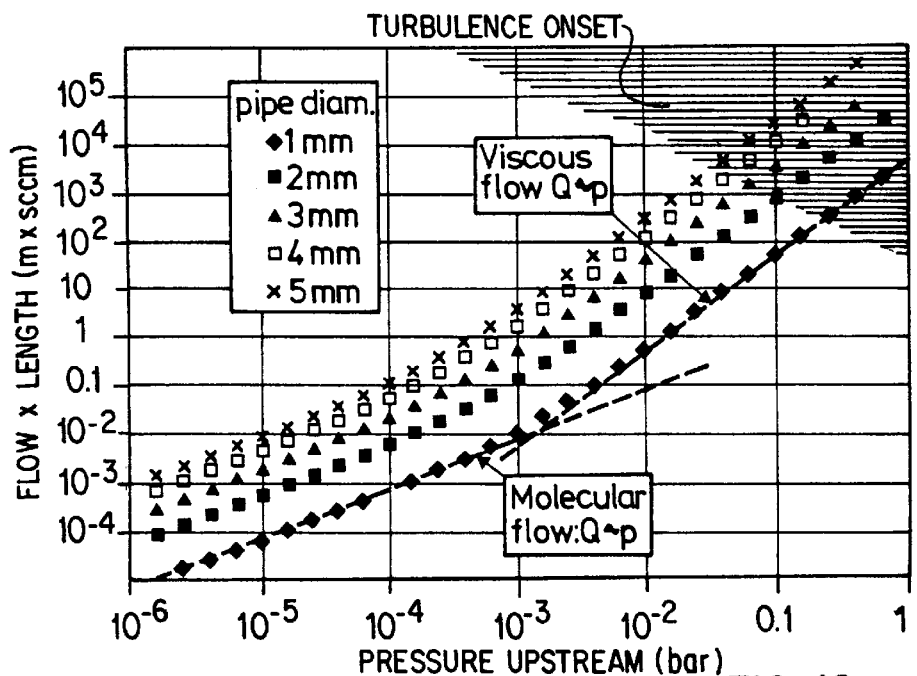
FIG. 16 characteristics of pressure drop along different tubes as examples of gas flow conductance elements.

The relation between pressure and gas flow is exemplified in FIG. 16. Thereby, the pressure downstream of the tube is assumed to be negligible, au in the process vacuum range. The gas flow is related to the upstream pressure in the one meter long tube. The upstream pressure varies inversely to the pipe length. The measurements were done with air at room temperature and would be different for other gases. The shaded area indicates when turbulence generates a departure from viscous flow model. It may be seen that for the range of operation in a typical low-pressure process system the gas flow in the pipe is essentially laminar or viscous. The flow regime is viscous over three decades, and there the flow range is proportional to the square of pressure.

A dynamic of a factor 1000 is quite comfortable for a given process system. Within this range it is easily possible to measure the flow based on the simple and reliable physical relation between flow and pressure.

Figure 17:
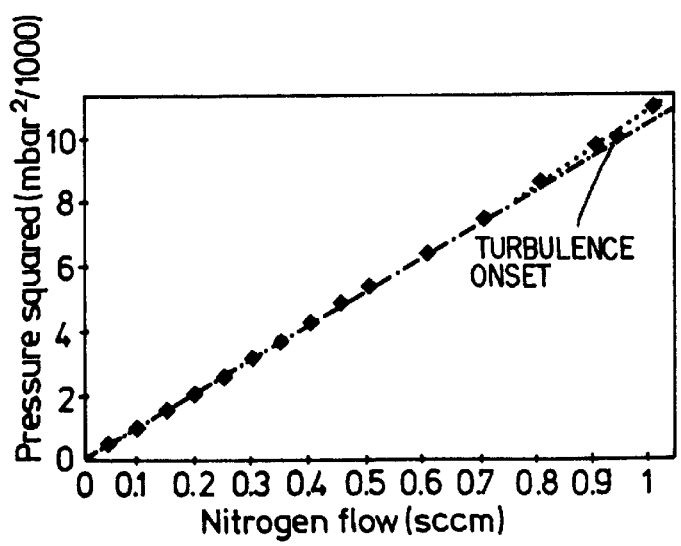
FIG. 17 pressure drop along such a tube and as a function of flow rate.

In FIG. 17 an example is shown of squared pressure as a function of Nitrogen flow in a 50 cm long, 2 mm inner diameter tube. Again, Nitrogen is flowed at room temperature and the pressure gauge used is a standard capacitive gauge. Therefrom, it may be seen that the relation of the flow to the square of pressure is well established. A slight deviation from linearity is observed for a very large flow. This is to be related to the onset of the turbulent regime. As the present invention makes use of such a flow conductance element as e.g. shown in FIG. 6 or FIG. 7 as a measuring tool, care should be taken to stay away from this area or then to take into account turbulence, at least when it is only a perturbation. Thereby, it must be emphasized, that for the present invention reproducibility is most important: It was carefully checked on many occasions and we found that the pressure to flow relation in an embodiment with a flow conductance element 8 according to FIG. 6, 7 and 9 is highly reproducible, even inside the turbulent regime.

Figure 9:
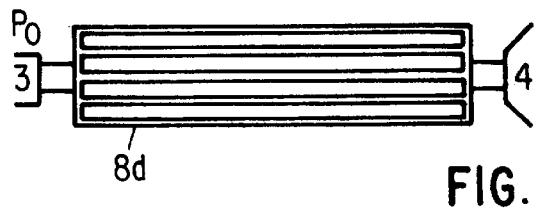
FIG. 9 a still further gas flow conductance element, especially used for rather large gas flows.

If large gas flows have to be realized, then the concept of the flow element 8 according to FIG. 9 is preferred. Thereby, a large gas flow may be used without having to fear turbulences. Onset of turbulences is defined by the Reynold's number. It brings a constraint on the flow $\emptyset$ and the pipe diameter D as $$\emptyset/D < a$$

wherein a is a constant.

Dividing the gas flow into N parallel and preferably equal flow streams within N equivalent flow conductance elements allows to play independently with the Reynold's number and the pressure drop along the combined flow conductance element 8. The same concept can be used to displace the flow regime along the flow element 8 from viscous flow dominated (at a single long pipe) to molecular flow dominated (at a dense array of short capillary tubes). The limit case is when the flow conductance element 8 is made of porous medium 8c with very small dimension flow paths for the gas between the grains.

One can also consider using a flow conductance element which is based on a nozzle, similarly to the representation of FIG. 7, with a very small orifice. In any case, the most important property of the flow conductance element 8 is not that it follows this or that flow dynamic rules. The most important parameter for the flow conductance element 8 is reproducibility. Thus, the main purpose of the flow conductance element 8 is not to measure the absolute value of the flow which is the job of the MFC, but is rather to check if the MFC is giving a constant and reproducible flow. This very important aspect of reproducibility and stability of the flow element 8 will be discussed below.

Before doing so let's turn back to the most generic aspect of the present invention according to FIG. 2 and consider some further embodiments.

Figure 4:
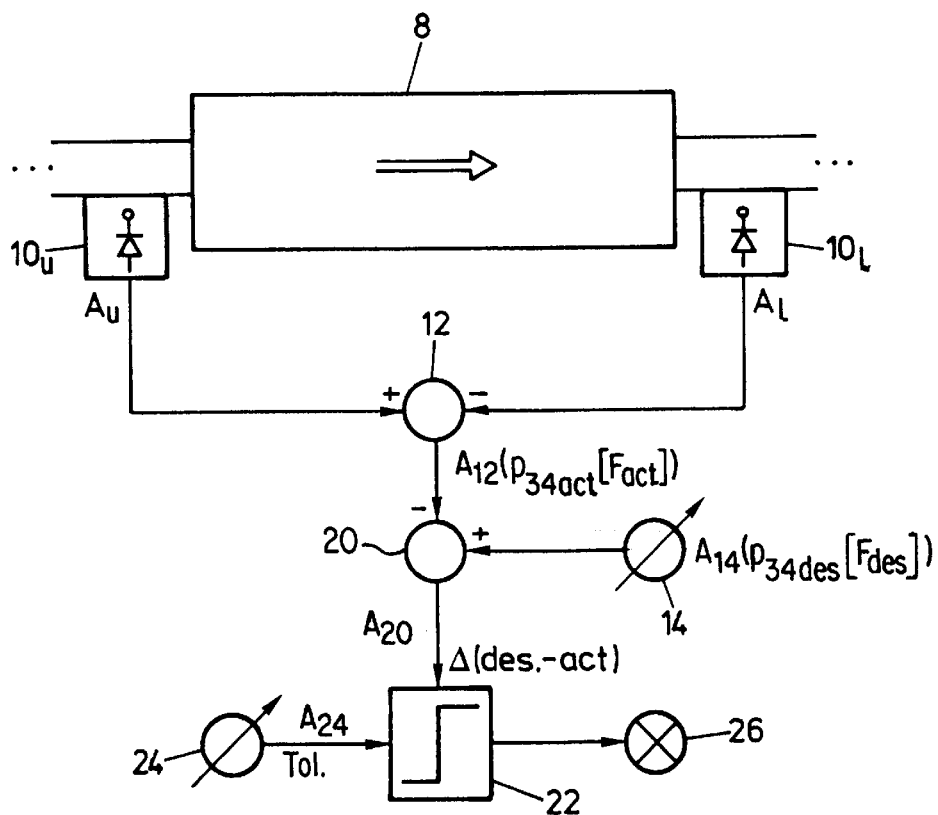
FIG. 4 departing from the representation of FIG. 2, schematically a further embodiment of the inventive arrangement and method, whereat reaching of a limit value is monitored, indicating the need of definite replacement of a mass flow controller.

According to FIG. 4, which is based on the representation according to FIG. 2, the output signal $A_{12}$ of the difference forming unit 12, which may be e.g. a difference amplifier, is dependent on the actual value of pressure drop $p_{34}$, which itself is dependent on the actual gas flow $F_{act}$.

This signal $A_{12}$ is led to one input of a further difference forming unit 20, the second input thereof being connected to an adjustable reference value unit 14 generating an output signal $A_{14}$. This output signal $A_{14}$ is preset according to a pre-measured pressure drop $p_{34}$ at flow element 8, which has been measured in a calibrating step at a well determined desired flow of gas $F_{des}$. Thus, $A_{14}$ represents the pressure drop $p_{14}$ along element 8 at the desired gas flow $F_{des}$. Any difference appearing as output-signal $A_{20}$ of difference forming unit 20 represents the degree of deviation between desired flow and actual flow. In the embodiment according to FIG. 4 this difference signal is led to a threshold sensitive unit 22 to which the output signal of an adjustable unit 24, $A_{24}$ for adjusting the threshold is led. With the unit 24 the tolerance band is set for still acceptable deviations between desired and actual flow. If the limit set by unit 24 is reached, an indication is generated, as schematically shown by alarm-light 26.

This enables to realise a clear indication as to when one or more than one MFCs 3 have to be replaced and recalibrated.

Figure 5:
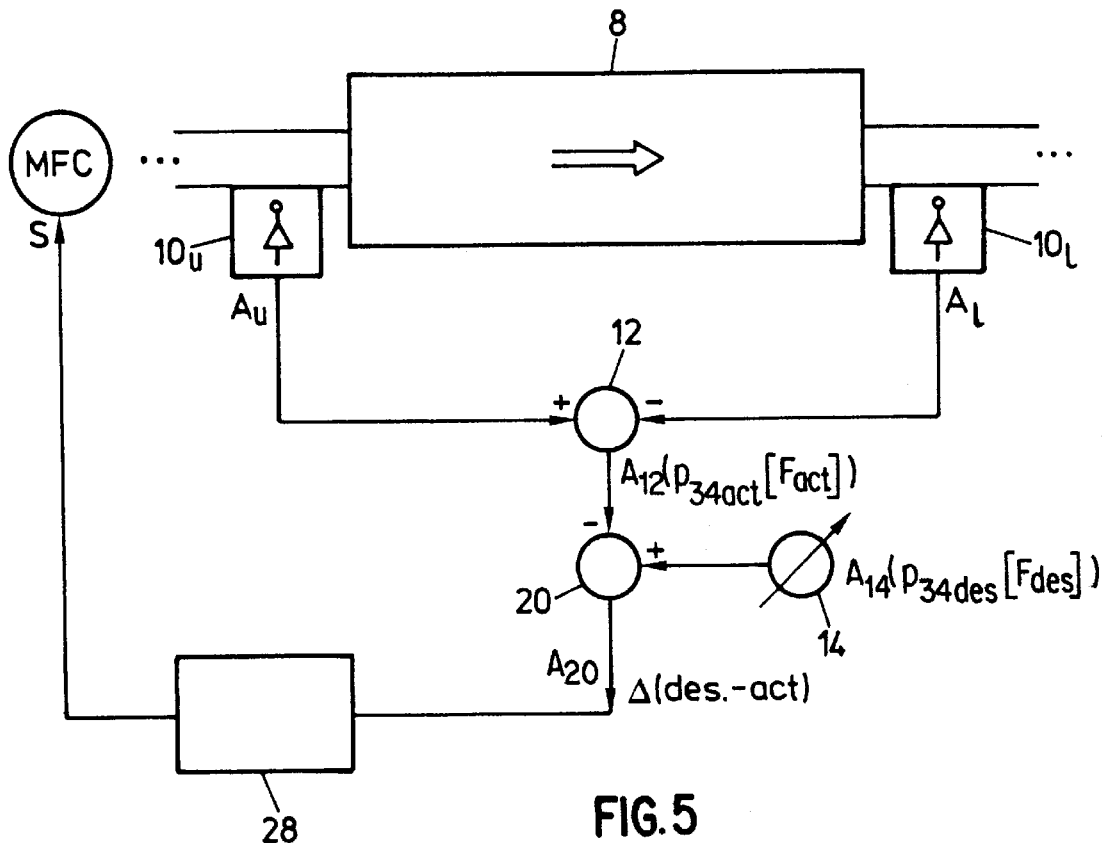
FIG. 5 in a representation according to FIG. 4 a further preferred form of realization of the inventive arrangement, operating according to the inventive method for automatically controlling the actual gas flow on a desired value.

In the embodiment according to FIG. 5 there is realized automatic readjustment of the MFC3. According to this figure, the output of difference forming unit 20 which represents the deviation Δ between the desired and actual flows F is fed via a controller unit 28 to the control input S of the MFC or to one or more than one control inputs of any controllable element upstream and/or downstream the element 8, which allow adjusting the gas flow. By the embodiment of FIG. 5 in a negative-feedback-control loop any inaccuracies of the MFC are automatically compensated—in dependency of open loop gain. The pressure drop across element 8 is used to measure the actual value in a negative-feedback-control loop for adjustably controlling same to follow a desired value set at the unit 14.

Figure 10:
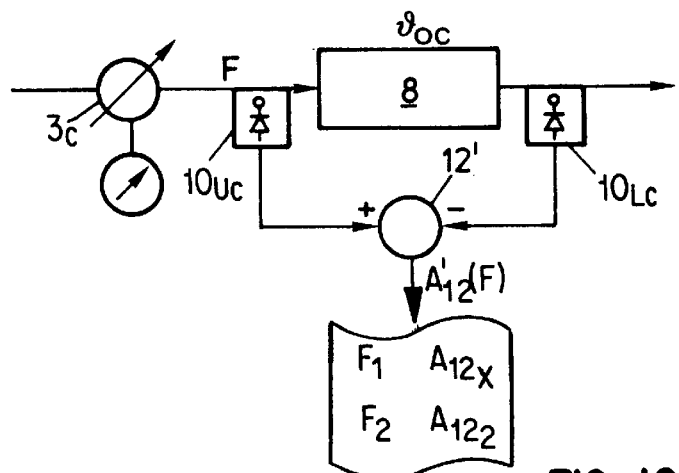
FIG. 10 a calibration arrangement for predetermining pressure drops along the gas flow conductance element at desired gas flows.

In FIG. 10 there is schematically shown the arrangement and the method for calibrating a predetermined flow conductance element 8 to be mounted in a new arrangement. With the help of a calibration mass-flow-controller 3$_c$, accurately indicating the actual flow of gas F, the pressure difference across the predetermined flow conductance element 8 is measured, preferably with the same arrangement of pressure gauges 10$_{dc}$ and 10$_{lc}$ for calibration as later used in plant operation. A calibration table in registered for all desired flows $F_x$ and the resulting output signal $A_{12}'_x$ according to these flows. The values $A_{12x}$ are later used to accordingly set the reference values $A_{14}$ in the embodiment according to FIGS. 4 and 5.

Figure 11:
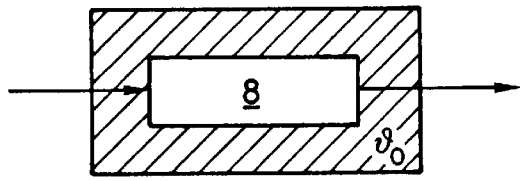
FIG. 11 schematically one possibility of temperature-controlling the gas flow conductance element.

A further problem which may arise is the problem of temperature control. The flow to pressure drop conversion at the used flow conductive element 8 in all its realization forms, e.g. according to the FIGS. 6 to 9, is very sensitive to temperature. As a consequence, for reproducible results it is important either to perform calibration according to FIG. 10 at the same temperature as measuring in operation or to take temperature differences between calibration and operation into account. According to FIG. 11, one preferred technique is to provide an appropriate temperature control of the flow element 8 on the temperature which was also prevailing during calibration. According to FIG. 11 the flow element 8 is embedded in a large compartment of material with high heat capacity which is brought to the desired temperature $\theta_o$ which accords to the calibration temperature $\theta_{oc}$.

Figure 12:
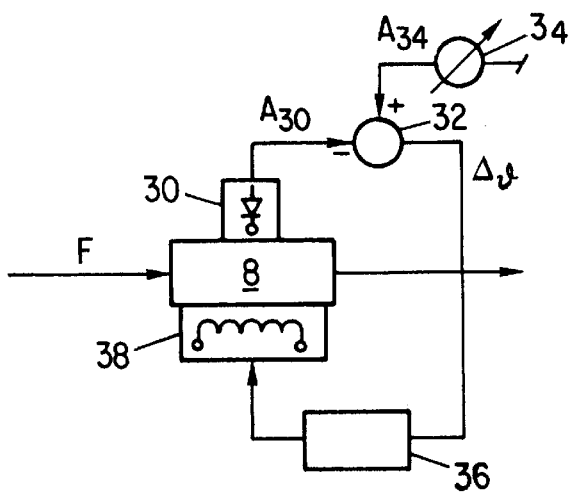
FIG. 12 a second and preferred form of realizing temperature control.

According to FIG. 12 there is provided at least one temperature sensor 30, thermically tightly coupled with the flow conductance element 8. The output signal $A_{30}$ thereof is fed to a difference forming unit 32, the second input thereof being fed by an adjustable reference signal unit 34 with a reference signal $A_{24}$. At the unit 34 a signal is adjusted which accords with a desired temperature at element 8. Thus, the output of the difference forming unit 32 is a function of the difference $\Delta_5$ between desired temperature and actual temperature and is negative fed back via a controller unit 36 to a heater and/or cooler element 38 tightly thermically coupled to the element 8. In this embodiment the temperature prevailing during operation of the flow element is negative-feedback-controlled on a predetermined value which accords to the calibrating temperature $\theta_{\circ c}$. It goes without saying that for calibration according to FIG. 10 it is clearly advised to provide the same temperature control technique for element 8, thereby preferably also a negative-feedback temperature-control loop according to FIG. 12 and set on that value which shall be established later in operation.

Figure 13:
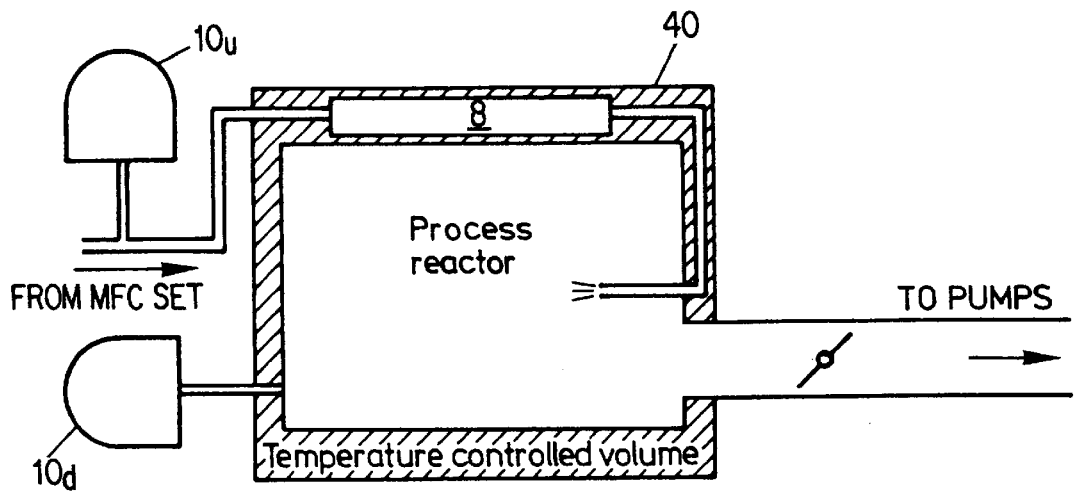
FIG. 13 a preferred form of temperature control of the gas flow conductance element at a temperature controlled vacuum reactor.

In FIG. 13 there in shown a further temperature control technique which is largely preferred if the vacuum facility 4, as e.g. a reaction vessel for surface treatment of substrates, is accurately temperature controlled. Thereby, the temperature control already provided for controlling the process within the reactor 4 is simultaneously exploited for controlling the temperature at the flow conductance element 8. According to FIG. 13 the flow element 8 is integrated into or at the wall 40 of a process reactor vessel, which for process control 16 itself accurately temperature controlled (not shown). Thereby, calibration has to be done at the same temperature at which the process reactor and its wall 40 will be operated during processing. Note that here again, as the downstream pressure gauge, there is used the pressure gauge 10$_d$ which monitors pressure of the process within the reactor.

Figure 14:
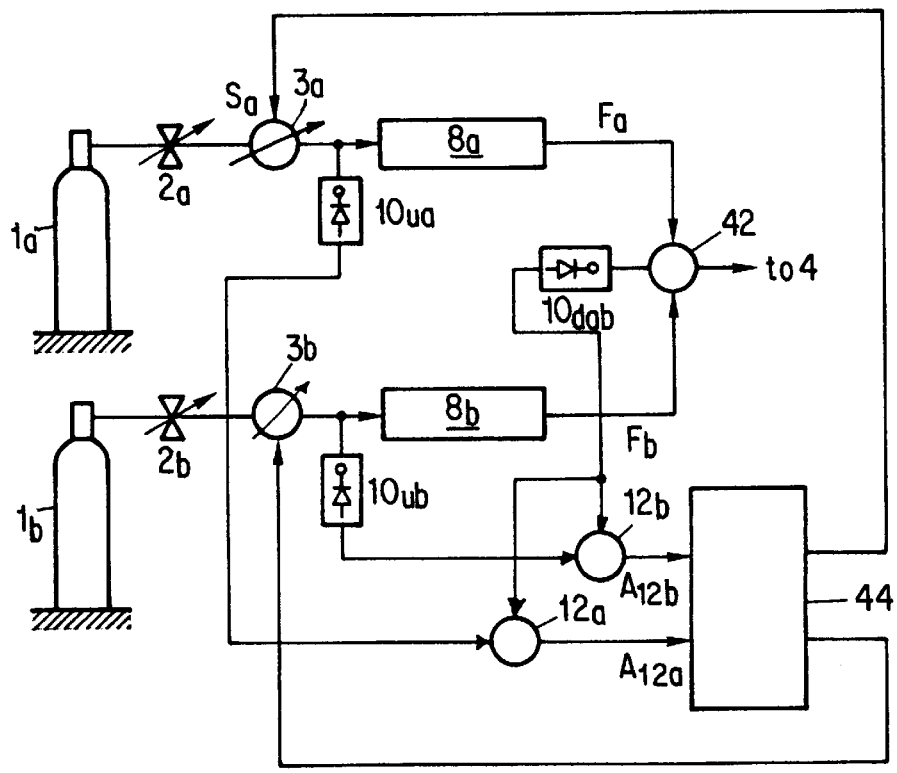
FIG. 14 schematically an inventive arrangement operating according to the inventive method for controlled feeding of a gas mixture to the vacuum facility.

Often in a given process operation a mixture of gases is used. In standard operation, when the mixture is made of a few gases with about the same proportions, then the inventive control can be realized by measuring the pressure drop $p_{34}$ as was shown at FIGS. 2, 4 and 5. Nevertheless, it might also be desirable to properly control each proportion of the mixture components separately, e.g. so as to properly control the mixing ratio too. This is schematically shown in FIG. 14. The same reference numbers are used as were already used e.g. in FIG. 2 for the two gas feed systems from a gas tank 1a and a gas tank 1b, both for one component, e.g. of a two-component gas mixture. The gas flows $F_a$ and $F_b$ are combined as schematically shown at 42.

The two flows $F_a$ and $F_b$ are monitored, whereby there is used a single downstream pressure gauge $10_{dab}$ for both flows. Thus, there results, as may clearly be seen, one indicative signal $A_{12a}$, $A_{12b}$ respectively for each actual gas flow which signals are led to an evaluating unit 44 by which each flow may separately be adjusted on the desired value and/or a desired flow ratio between the two flows $F_a$, $F_b$ may be automatically regulated. This technique may be used irrespective of the relative contribution of the gas components to the final gas mixture.

If a gas mixture with a minority gas component is to be controllably introduced to the vacuum facility 4 and it is not required to separately monitor the respective actual gas flows, then it is proposed to follow up the following procedure with an arrangement e.g. as shown in FIG. 4:

Open flow for minority gas and set the one mass flow controller provided to the desired minority gas flow.

Monitor the resulting pressure drop $p_{22}$ for minority gas flow, e.g. by monitoring $A_{12}$.

Compare the monitored pressure drop $p_{23}$ for the minority gas flow, e.g. according to $A_{12}$ with the respective value found during calibration procedure.

Decide whether the monitored actual value differs too much from a predetermined deviation value according to $A_{14}$ of FIG. 4, if it does abort and check.

If the actual measurement does not differ beyond the preset tolerance, repeat for other minority gases.

If the flow control for the minority gases is accurate, open the majority gas flow and set the flow to the desired value by means of the mass flow controller.

Monitor the resulting pressure drop $p_{22}$ by means e.g. of signal $A_{12}$.

Check on tolerable deviation between actual value according to $A_{12}$ and value according calibration ($A_{14}$). Abort if the difference between calibrated value and actual value is too large. If difference in o.k., start process.

Figure 15:
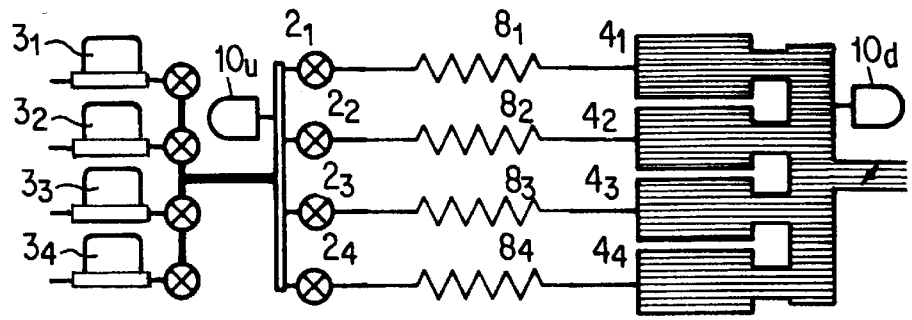
FIG. 15 in a schematic representation an inventive arrangement operating according to the inventive method for operating two or more parallel operated vacuum facilities, especially vacuum treatment reactors.

In FIG. 15 there is shown schematically a preferred incorporation of the present invention to parallel reactor processing. Thereby, it is clear that it is absolutely possible to control the flow of gas or gases to each of the parallel process reactors as was explained with the help of FIGS. 2, 4, 5.

According to FIG. 15 a parallel system of n reactors, e.g. $4_1$ to $4_4$, is provided and the gas flow is divided into n equal sub-flows by a divider made of n equal flow conductance elements $8_n$, according to FIG. 15, $8_1$ to $8_4$.

For normal control of the flow delivered by the set of n MFCs the operation of a parallel system is exactly identical as for the single reactor system according to FIG. 2, 4 or 5. All valves $2_n$ are open and the controlled conductance is the conductance resulting from all the n parallel flow elements 8a.

Another manner of operating a parallel reactor plant is controlling if all the conductances of the flow divider are exactly balanced. For this procedure it is proposed to:

open one MFC to given predetermined flow, close all valves $2_n$ except one, monitor the resulting pressure drop at the pressure gauges $10_u$ and $10_d$, repeat for all valves $2_n$ still having the one MPC opened and set at the predetermined flow value.

In operation and by monitoring the pressure drop between the pressure gauges $10_u$ and $10_d$ an unbalance of the gas flows through all the flow elements $8_n$ will appear as a fluctuation of the measured pressure drop. Again, an accurate calibration is needed for a comparison with the measured actual pressure drop.

It is evident that the present invention opens a wide range of possibilities for automatically controlling the flow of single gases or gas mixtures, thereby additionally monitoring their flow ratio, to single and to parallel processing vacuum facilities. It is especially advantageous when using complex gas mixtures and for processes which are very sensitive to gas mixture composition. Typical examples are Low-Pressure CVD, as for semi-conductor doping processes, PECVD, as for producing Silicon-Nitride layers, reactive etching and reactive sputtering. Thus, the invention is well suited for all vacuum processes which necessitate an accurate control of gas flow and/or of gas mixture composition, especially when using highly reactive gases, which quickly spoil customary MFCs or which produce dust.

What is claimed is:

1. A method for monitoring the actual flow of a gas into a vacuum facility, which flow of gas resulting from setting a desired flow of gas by means of at least one adjustable sass flow controller, interconnected between said facility and a pressurized reservoir arrangement for said gas, comprising the steps of:

interconnecting between said facility and said mass flow controller a gas flow conductance element.

predetermining a pressure drop along said gas flow conductance element at said desired flow of gas to be set by said mass flow controller, monitoring said actual gas flow by measuring a pressure drop along said gas flow conductance element, comparing said measured pressure drop with said predetermined pressure drop.

2. The method of claim 1, further comprising the step of selecting said flow conductance element so that said predetermined pressure drop is at least 0.1 bar at said desired flow of gas.

3. The method of claim 2, wherein said predetermined pressure drop is up to 1 bar at said desired flow of gas.

4. The method of claim 1, comprising the step of generating a difference signal from said comparing and further comparing said difference signal with a predetermined threshold signal and generating an indicative signal as soon as said difference signal reaches said threshold signal.

5. The method of claim 1, further comprising the step of generating a difference signal from said comparing and adjusting a mass flow control element between said reservoir and said facility as a function of said difference signal so as to negative-feedback-control said gas flow onto said desired gas flow.

6. The method of claim 1, further comprising the step of providing at least one of a tube, a constriction of flow cross-section of a gas flow line, a porous member within such gas flow line an said gas flow conductance element.

7. The method of claim 1, thereby predetermining said pressure drop at said conductance element by flowing predetermined calibration mass flow of said gas along said flow element, measuring a resulting pressure difference between a pressure at one end of said element and a pressure at the other end of said flow conductance element.

8. The method of claim 1, further comprising the step of measuring said pressure drop by measuring a first pressure upstream said flow conductance element and a second pressure downstream said conductance element and forming a difference signal from said first and second pressures measured.

9. The method of claim 1, further comprising the step of predetermining said pressure drop at a first temperature, measuring said pressure drop at a second temperature, thereby selecting said first and second temperatures to be at least substantially equal or adjusting at least one of said two pressure drops according to a prevailing difference of said first and second temperatures.

10. The method of claim 1, further comprising the step of controlling the temperature of said flow conductance element.

11. The method of claim 1, further comprising the step of negative-feedback-controlling the temperature of said flow conductance element.

12. The method of claim 1, further comprising the step of tightly coupling said flow conductance element thermically to an area of said facility being temperature controlled.

13. The method of claim 12, further comprising the step of integrating said flow conductance element to or into a wall of a temperature controlled vacuum recipient.

14. The method of claim 1, further comprising the step of predetermining and/or monitoring said respective pressure drops by means of at least one capacitive type pressure gauge.

15. The method of claim 1, further comprising the step of providing at least two parallel flow conductance elements, said at least two parallel flow conductance elements forming said one flow conductance element.

16. The method of claim 1, wherein said facility being formed by at least two parallel operated sub-facilities, each of said parallel operated facilities being separately monitored with respect to flow of gas thereto or at least a group of said sub-facilities being commonly monitored with respect to flow of gas thereto.

17. The method of claim 1, further comprising the step of selecting said flow conductance element for a range of desired flows of gas so as to result in a non-turbulent flow therealong.

18. The method of claim 17, further comprising the step of selecting said flow conductance element as a number of parallel flow conductance elements so as to avoid occurrence of turbulences.

19. The method of claim 18, further comprising selecting said parallel flow conductance elements to be nominally equal flow conductance elements.

20. The method of claim 1, wherein said facility is at least one vacuum treatment reactor for at least one workpiece.

21. The method of claim 1, wherein said facility is at least one of a plasma-enhanced chemical vapour deposition reactor and of a low pressure chemical vapour deposition reactor.

22. The method of claim 1, further comprising the step of selecting the minimum flow cross-section of said flow conductance element large enough to prevent significant cross-section reduction by dust deposition, thereby compensating for said large enough flow cross-section by accordingly lengthening said flow conductance element.

23. The method of claim 1, wherein said gas is a gas mixtures further comprising the step of performing said method for at least a part of gas mixture components independently and mixing said gas upstream said facility and downstream said flow conductance elements.

24. The method of claim 1, wherein said gas is a gas mixture, further comprising the step of predetermining said pressure drop along said gas flow conductance element for at least a part of components forming said gas mixture and predetermining said pressure drop along said flow conductance element for said gas mixture, monitoring said pressure drop caused by said at least one part of said components before operating said facility and monitoring said pressure drop caused by said gas mixture during operating said facility.

25. The method of claim 1, further comprising the step of selecting said at least one flow conductance element so as to cause a pressure drop at said desired mass flow of gas which is a substantial part of an overall pressure drop between a pressure regulator downstream said pressurized reservoir and said facility.

* * * * *